(12) United States Patent
Syu et al.

(10) Patent No.: US 11,742,657 B2
(45) Date of Patent: Aug. 29, 2023

(54) ELECTROSTATIC DISCHARGE PROTECTION CIRCUIT

(71) Applicant: Winbond Electronics Corp., Taichung (TW)

(72) Inventors: Jhih-Chun Syu, Taichung (TW); Chao-Lung Wang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 15 days.

(21) Appl. No.: 17/574,572

(22) Filed: Jan. 13, 2022

(65) Prior Publication Data

US 2022/0352710 A1 Nov. 3, 2022

(30) Foreign Application Priority Data

Apr. 29, 2021 (TW) .................................. 110115546

(51) Int. Cl.
*H02H 9/04* (2006.01)
*H01L 27/02* (2006.01)

(52) U.S. Cl.
CPC ......... *H02H 9/046* (2013.01); *H01L 27/0285* (2013.01)

(58) Field of Classification Search
CPC .... H02H 9/046; H01L 27/027; H01L 27/0285

USPC ............................................................ 361/56
See application file for complete search history.

(56) References Cited

U.S. PATENT DOCUMENTS

| | | | | |
|---|---|---|---|---|
| 5,959,488 A | * | 9/1999 | Lin | H01L 27/0251 327/566 |
| 6,501,632 B1 | * | 12/2002 | Avery | H02H 9/046 361/111 |
| 7,242,561 B2 | | 7/2007 | Ker et al. | |
| 2001/0033004 A1 | * | 10/2001 | Lin | H01L 27/0251 257/360 |
| 2018/0211949 A1 | * | 7/2018 | Uzawa | H01L 27/0255 |

* cited by examiner

*Primary Examiner* — Kevin J Comber
(74) *Attorney, Agent, or Firm* — JCIPRNET

(57) ABSTRACT

An electrostatic discharge (ESD) protection circuit includes a first transistor, a second transistor, a capacitor, a voltage dividing circuit, and a first diode. The first transistor is coupled between a first power rail and a second power rail. The second transistor is coupled between the first power rail and the second power rail. A bulk of the second transistor is coupled to a control terminal of the first transistor. The capacitor is coupled between the first power rail and a control terminal of the second transistor. The voltage dividing circuit is coupled between the control terminal of the second transistor and the second power rail, and has a divided voltage output terminal coupled to the bulk of the second transistor. The first diode is coupled between the divided voltage output terminal and the second power rail.

18 Claims, 4 Drawing Sheets

ELECTROSTATIC DISCHARGE PROTECTION CIRCUIT

CROSS-REFERENCE TO RELATED APPLICATION

This application claims the priority benefit of Taiwan application serial no. 110115546, filed on Apr. 29, 2021. The entirety of the above-mentioned patent application is hereby incorporated by reference herein and made a part of this specification.

BACKGROUND

Technical Field

The disclosure relates to an electrostatic discharge protection circuit, and in particular to an electrostatic discharge protection circuit that can improve the electrostatic discharge protection capability.

Description of Related Art

In the prior art, in order to ensure that an integrated circuit is not damaged by electrostatic discharge, an electrostatic discharge protection circuit is usually added to the integrated circuit to provide a dissipating path for an electrostatic discharge current and prevent circuit elements from being damaged. In the conventional technology, a power clamp circuit is often disposed between power rails as the electrostatic discharge protection circuit.

During an electrostatic discharge phenomenon, a positive pulse voltage or a negative pulse voltage may be generated between the power rails of the integrated circuit. The electrostatic discharge protection circuit needs to effectively generate the current dissipating path in response to the conditions in order to execute an effective protection action for the integrated circuit. In the conventional technology, the circuit elements are often disposed in response to different voltage pulse states in the electrostatic discharge phenomenon to provide the current dissipating path. Such approach often requires additional circuit elements and causes wastage of circuit layout area.

SUMMARY

The disclosure provides an electrostatic discharge protection circuit, which can reduce the circuit layout area and improve the electrostatic discharge protection capability.

The electrostatic discharge protection circuit of the disclosure includes a first transistor, a second transistor, a capacitor, a voltage dividing circuit, and a first diode. The first transistor is coupled between a first power rail and a second power rail. The second transistor is coupled between the first power rail and the second power rail, and a bulk of the second transistor is coupled to a control terminal of the first transistor. The capacitor is coupled between the first power rail and a control terminal of the second transistor. The voltage dividing circuit is coupled between the control terminal of the second transistor and the second power rail, and has a divided voltage output terminal coupled to the bulk of the second transistor. The first diode is coupled between the divided voltage output terminal and the second power rail.

Based on the above, the disclosure forms a diode between the bulk of the second transistor and a capacitor-resistor network for providing a bias voltage of the control terminal of the second transistor. Through the diode, when a negative voltage pulse is generated, a path may be provided to instantly conduct the first transistor, and the dissipating path for an electrostatic discharge current is quickly provided, which effectively improves the electrostatic discharge protection capability. In the embodiment, the diode may be formed through materials of a resistor (N-type) and a substrate (P-type) in an integrated circuit, and no additional layout arrangement is required, which can save the circuit layout area.

DETAILED DESCRIPTION OF DISCLOSED EMBODIMENTS

Figure 1:
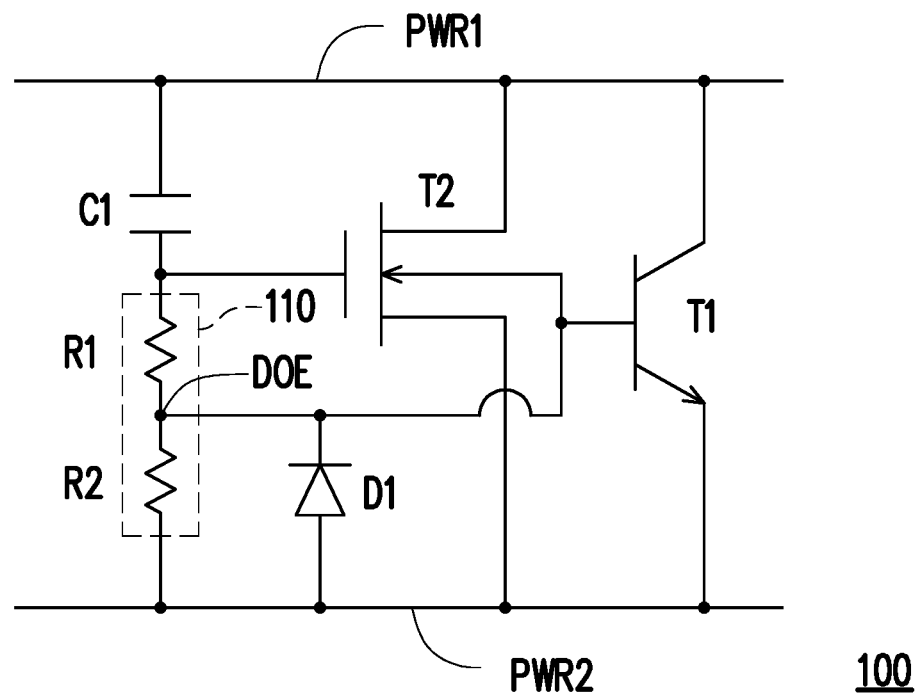
FIGS. 1 and 4 are schematic views of electrostatic discharge protection circuits according to different embodiments of the disclosure.

Please refer to FIG. 1. FIG. 1 is a schematic view of an electrostatic discharge protection circuit according to an embodiment of the disclosure. An electrostatic discharge protection circuit 100 includes transistors T1 and T2, a capacitor C1, a voltage dividing circuit 110, and a diode D1. The transistor T1 is coupled between a first power rail PWR1 and a second power rail PWR2. The transistor T2 is coupled between the first power rail PWR1 and the second power rail PWR2. A bulk of the transistor T2 is coupled to a control terminal of the transistor T1. In the embodiment, the transistor T1 is a bipolar junction transistor (BJT), and the transistor T2 may be a metal-oxide-semiconductor field-effect transistor (MOSFET). In detail, the transistor T1 may be an NPN-type BJT, and the transistor T2 may be an N-type MOSFET.

In the embodiment, the first power rail PWR1 may be used to receive a supply voltage, and the second power rail PWR2 may be used to receive a ground voltage.

In addition, the capacitor C1 is coupled between the first power rail PWR1 and a control terminal of the transistor T2. The control terminal of the transistor T2 is a gate terminal thereof. The voltage dividing circuit 110 is coupled between the control terminal of the transistor T2 and the second power rail PWR2. The voltage dividing circuit 110 has a divided voltage output terminal DOE coupled to the bulk of the transistor T2. In the embodiment, the voltage dividing circuit 110 includes resistors R1 and R2. One terminal of the resistor R1 is coupled to the control terminal of the transistor T2, and the other terminal of the resistor R1 is coupled to the divided voltage output terminal DOE. One terminal of the resistor R2 is coupled to the divided voltage output terminal DOE, and the other terminal of the resistor R2 is coupled to the second power rail PWR2.

An anode of the diode D1 is coupled to the second power rail PWR2, and a cathode of the diode D1 is coupled to the divided voltage output terminal DOE and is coupled to the bulk of the transistor T2 through the divided voltage output terminal DOE.

In the embodiment, the capacitor C1 and the voltage dividing circuit 110 are used to divide a positive pulse voltage when the positive pulse voltage is generated on the first power rail PWR1 due to an electrostatic discharge phenomenon, and conduct the transistor T1 when a bias voltage is generated at the divided voltage output terminal DOE. A current dissipating path is generated through conducting the transistor T1 to achieve the function of electrostatic discharge protection.

On the other hand, when a negative pulse voltage is generated on the first power rail PWR1 due to the electrostatic discharge phenomenon, the diode D1 may be conducted corresponding to the negative pulse voltage, and the bias voltage is provided to conduct the transistor T1. Similarly, the current dissipating path may be generated through conducting the transistor T1 to achieve the function of electrostatic discharge protection.

Figure 2:
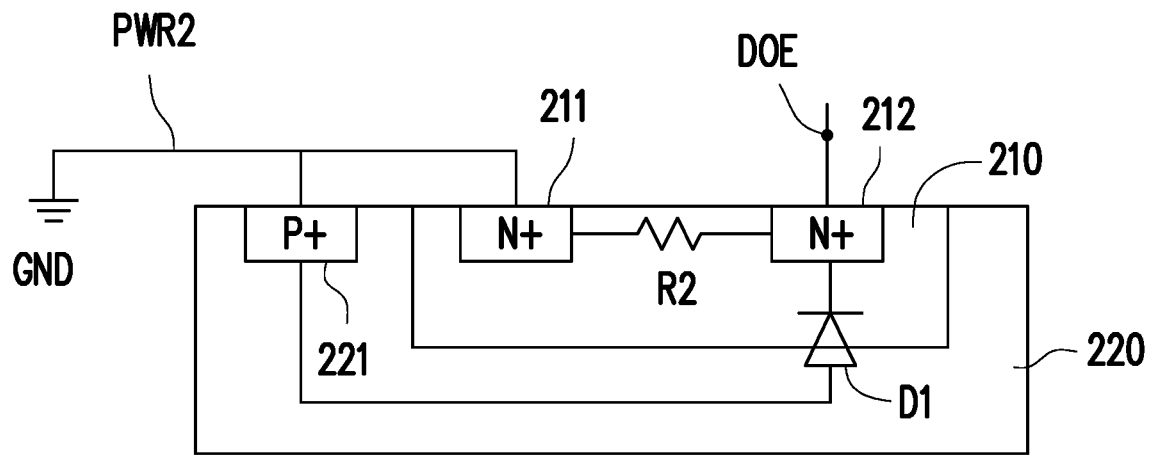
FIG. 2 is a cross-sectional view of a layout structure of a resistor R2 and a diode D1 in the embodiment of FIG. 1 of the disclosure.

Please refer to FIG. 1 and FIG. 2 simultaneously. FIG. 2 is a cross-sectional view of a layout structure of the resistor R2 and the diode D1 in the embodiment of FIG. 1 of the disclosure. The electrostatic discharge protection circuit 100 is disposed in an integrated circuit. The integrated circuit has a substrate 220 and a well 210. The well 210 is disposed in the substrate 220. The well 210 includes doped regions 211 and 212. In the embodiment, the substrate 220 may be a P-type substrate, the well 210 may be an N-type well, and the doped regions 211 and 212 may both be N+-type doped regions.

In the embodiment, the resistor R2 may be used as the N-type well and is formed between the doped regions 211 and 212. Through coupling the doped region 211 to the divided voltage output terminal DOE and coupling the doped region 212 to the second power rail PWR2, the circuit structure of FIG. 1 may be implemented.

On the other hand, the substrate 220 further has a doped region 221. The doped region 221 may be a P+-type doped region and is coupled to the second power rail PWR2. In this way, a P-N junction formed by the substrate 220 and the well 210 may construct the diode D1. In addition, an anode of the diode D1 may be coupled to the second power rail PWR2 through the doped region 221, and a cathode of the diode D1 may be coupled to the divided voltage output terminal DOE through the doped region 212.

From the above description, it is not difficult to know that the diode D1 in the embodiment may be constituted by a parasitic effect generated during the layout of the resistor R2, and no additional layout area is required. Therefore, the layout area of the electrostatic discharge protection circuit 100 according to the embodiment of the disclosure can be effectively reduced.

Figure 3B:
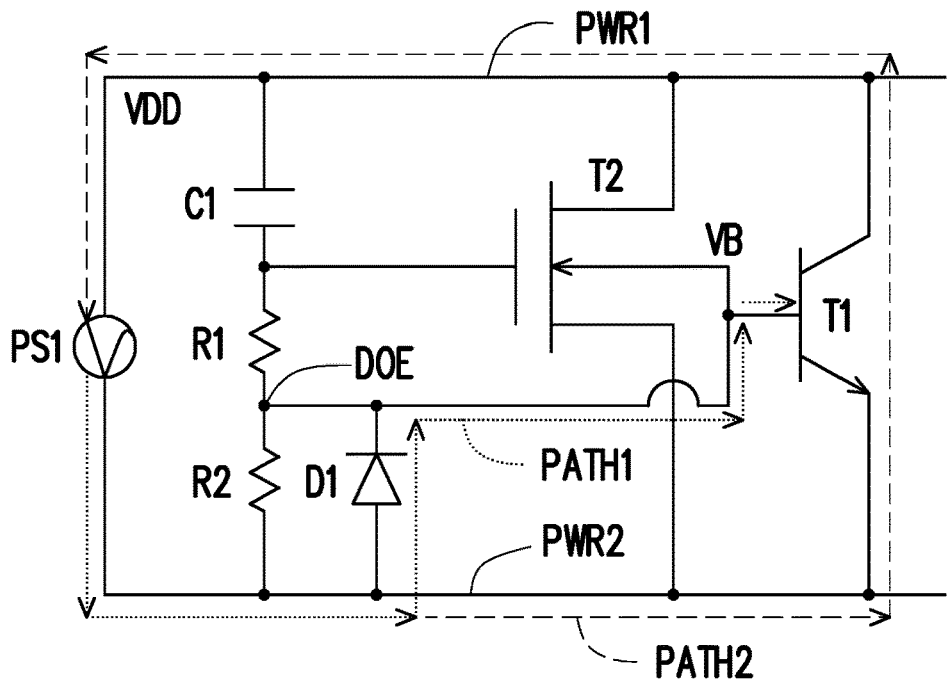
FIG. 3A and FIG. 3B are schematic views of electrostatic discharge protection actions of an electrostatic discharge protection circuit according to an embodiment of the disclosure.
Figure 3A:
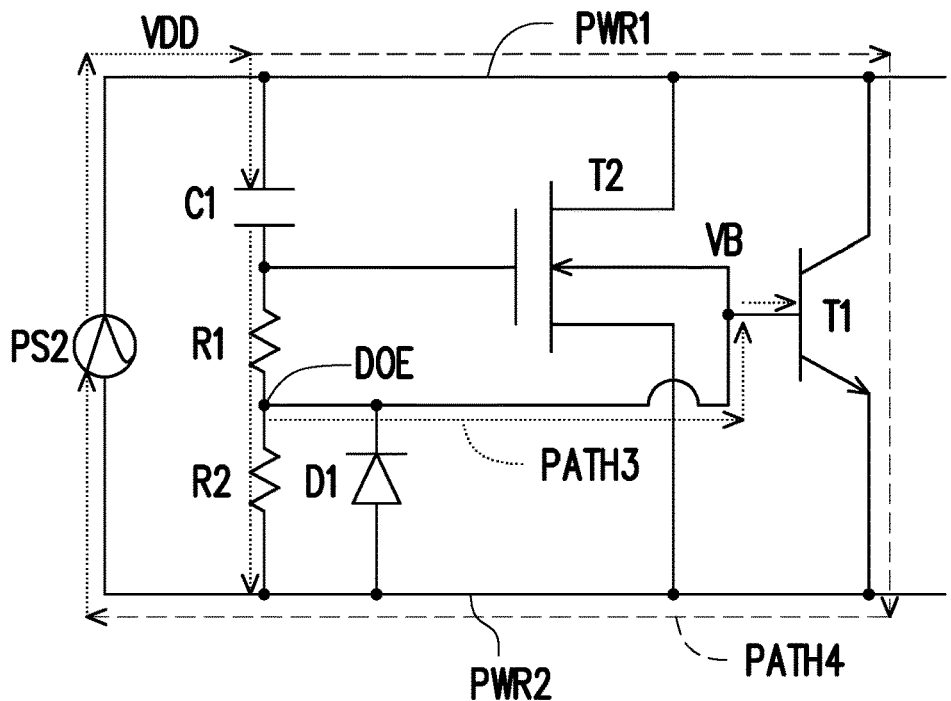

Please refer to FIG. 3A and FIG. 3B. FIG. 3A and FIG. 3B are schematic views of electrostatic discharge protection actions of an electrostatic discharge protection circuit according to an embodiment of the disclosure. In FIG. 3A, an electrostatic discharge protection circuit 300 has the same circuit structure as the electrostatic discharge protection circuit 100, and the relevant details will not be repeated. When a negative pulse voltage PS1 is generated between a first power rail PWR1 and a second power rail PWR2 due to an electrostatic discharge phenomenon, a diode D1 may be conducted according to the negative pulse voltage PS1, and a path PATH1 is generated between the negative pulse voltage PS1, the diode D1, and a control terminal (base) of a transistor T1. Through the path PATH1, a bias voltage VB may be provided to the control terminal of the transistor T1 according to the negative pulse voltage PS1, and the transistor T1 is conducted. In this way, the transistor T1 may provide a current dissipating path PATH2 for electrostatic discharge protection.

On the other hand, when a positive pulse voltage PS2 is generated between the first power rail PWR1 and the second power rail PWR2 due to the electrostatic discharge phenomenon, a capacitor-resistor network constituted by a capacitor C1 and resistors R1 and R2 may generate the bias voltage VB on a divided voltage output terminal DOE according to the positive pulse voltage PS2. The bias voltage VB may be provided to the control terminal of the transistor T1 through a path PATH3. In this way, the transistor T1 may be conducted and provide a current dissipating path PATH4 for electrostatic discharge protection.

Figure 4:
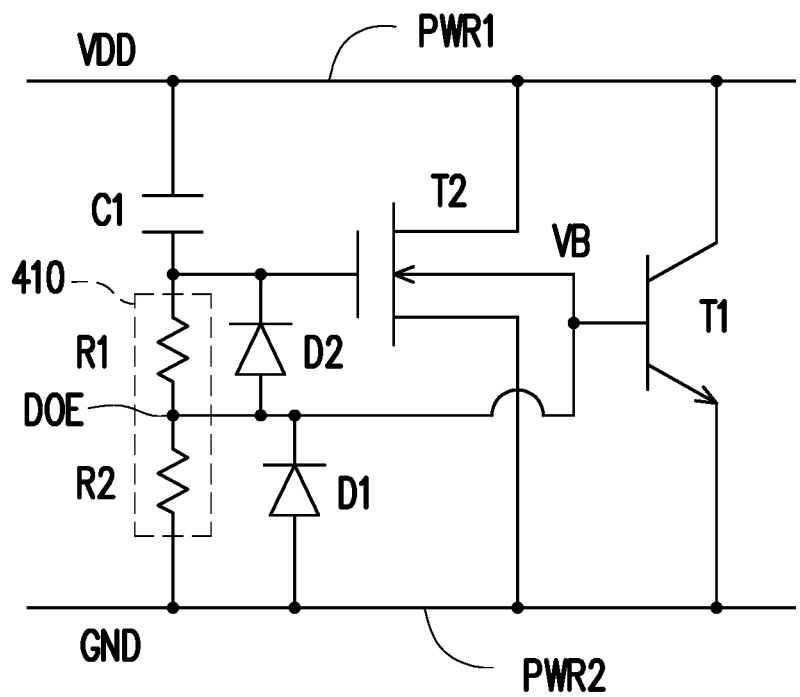

Please refer to FIG. 4. FIG. 4 is a schematic circuit view of an electrostatic discharge protection circuit according to another embodiment of the disclosure. An electrostatic discharge protection circuit 400 includes transistors T1 and T2, a capacitor C1, a voltage dividing circuit 410, and diodes D1 and D2. The transistor T1 is coupled between a first power rail PWR1 and a second power rail PWR2. The transistor T2 is coupled between the first power rail PWR1 and the second power rail PWR2. A bulk of the transistor T2 is coupled to a control terminal of transistor T1. In the embodiment, the transistor T1 is a BJT, and the transistor T2 may be a MOSFET. In detail, the transistor T1 may be an NPN-type BJT, and the transistor T2 may be an N-type MOSFET.

In addition, the capacitor C1 is coupled between the first power rail PWR1 and a control terminal of the transistor T2. The control terminal of the transistor T2 is a gate terminal. The voltage dividing circuit 410 is coupled between the control terminal of the transistor T2 and the second power rail PWR2. The voltage dividing circuit 410 has a divided voltage output terminal DOE coupled to the bulk of the transistor T2. In the embodiment, the voltage dividing circuit 410 includes resistors R1 and R2. One terminal of the resistor R1 is coupled to the control terminal of the transistor T2, and the other terminal of the resistor R1 is coupled to the divided voltage output terminal DOE. One terminal of the resistor R2 is coupled to the divided voltage output terminal DOE, and the other terminal of the resistor R2 is coupled to the second power rail PWR2. The first power rail PWR1 and the second power rail PWR2 respectively receive a supply voltage VDD and a ground voltage GND.

In the embodiment, an anode of the diode D1 is coupled to the second power rail PWR2, and a cathode of the diode D1 is coupled to the divided voltage output terminal DOE and is coupled to the bulk of the transistor T2 through the divided voltage output terminal DOE. In addition, different from the foregoing embodiment, the electrostatic discharge protection circuit 400 of the present embodiment further includes the diode D2. An anode of the diode D2 is coupled to the divided voltage output terminal DOE, and a cathode of the diode D2 is coupled to the control terminal of the transistor T2, that is, the gate of the transistor T2.

Figure 5:
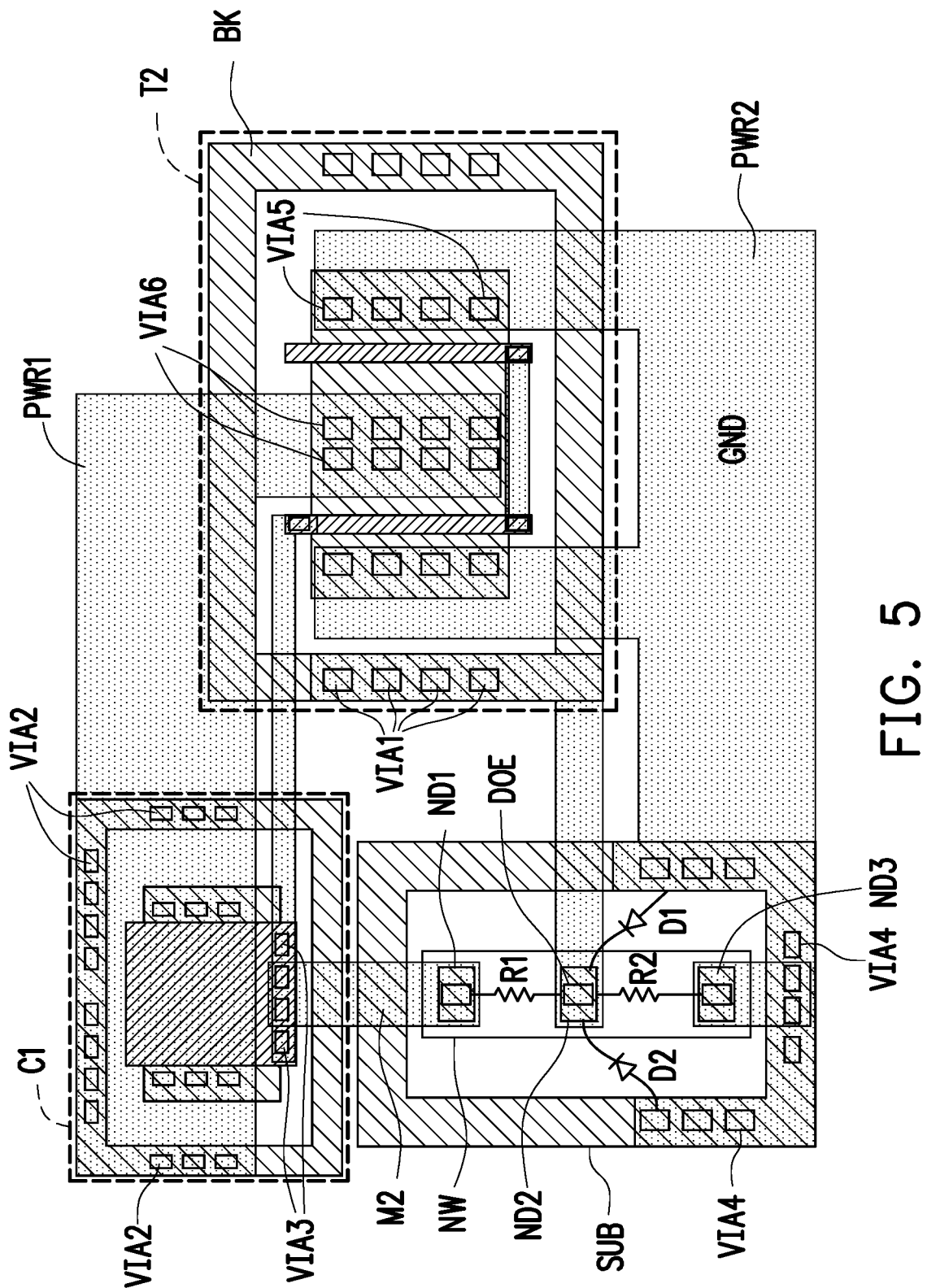
FIG. 5 is a top view of a partial layout structure of an electrostatic discharge protection circuit 400 in the embodiment of FIG. 4 of the disclosure.

Please refer to FIG. 5. FIG. 5 is a top view of a partial layout structure of the electrostatic discharge protection circuit 400 in the embodiment of FIG. 4 of the disclosure. A first plate of the capacitor C1 is electrically connected to the first power rail PWR1 through multiple connection windows VIA2. The first power rail PWR1 is used to receive the supply voltage VDD. A second plate of the capacitor C1 may be electrically connected to a gate G1 of the transistor T2 through multiple connection windows VIA3 and a transmission line M1. In addition, the second plate of the capacitor C1 is electrically connected to a N-type well NW through a transmission line M2. There are multiple doped regions ND1 to ND3 in the N-type well. The resistor R1 may be formed between the doped regions ND1 to ND2, and the resistor R2 may be formed between the doped regions ND2 to ND3. The doped region ND2 may provide the divided voltage output terminal DOE.

In addition, the N-type well NW is disposed in a substrate SUB. The substrate SUB is electrically connected to the second power rail PWR2 through multiple connection windows VIA4. The second power rail PWR2 is used to receive the ground voltage GND. The substrate SUB is a P-type substrate and forms a P-N junction with the N-type well NW to generate the diodes D1 and D2, wherein the diode D1 is coupled between the doped region ND2 and a bulk BK (a doped region) of the transistor T2 That is to say, in the disclosure, the diodes D1 and D2 do not require additional layout, which effectively reduces the required circuit layout area.

In addition, a bulk BK of the transistor T2 is electrically connected to the divided voltage output terminal DOE through multiple connection windows VIA1. A first terminal (drain) of the transistor T2 is electrically coupled to the first power rail PWR1 through multiple connection windows VIA6, and a second terminal (source) of the transistor T2 is electrically coupled to the second power rail PWR2 through multiple connection windows VIA5. A control terminal (base) of the transistor T1 is embedded in the bulk of the transistor T2 and is electrically coupled to the divided voltage output terminal DOE through the connection windows VIA1. A first terminal (collector) of the transistor T1 is embedded in the first terminal (drain) of the transistor T2 and is electrically coupled to the first power rail PWR1 through the connection windows VIA6. A second terminal (emitter) of the transistor T1 is embedded in the second terminal (source) of the transistor T2 and is electrically coupled to the second power rail PWR2 through the connection windows VIA5. Therefore, the transistor T1 does not require additional layout space, which can effectively reduce the required circuit layout area.

In summary, in the electrostatic discharge protection circuit of the disclosure, under the premise that no additional layout area is required, through disposing the reverse-biased diode between the bulk of the MOSFET and the second power rail, the protection capability of the electrostatic discharge phenomenon of the negative pulse voltage can be effectively improved, thereby improving the reliability of the integrated circuit.

What is claimed is:

1. An electrostatic discharge protection circuit, comprising:
   a first transistor, coupled between a first power rail and a second power rail;
   a second transistor, coupled between the first power rail and the second power rail, wherein a bulk of the second transistor is coupled to a control terminal of the first transistor;
   a capacitor, coupled between the first power rail and a control terminal of the second transistor;
   a voltage dividing circuit, coupled between the control terminal of the second transistor and the second power rail, and having a divided voltage output terminal coupled to the bulk of the second transistor; and
   a first diode, coupled between the divided voltage output terminal and the second power rail,
   wherein the voltage dividing circuit comprises:
   a first resistor, having a first terminal coupled to the control terminal of the second transistor and a second terminal of the first resistor coupled to the divided voltage output terminal; and
   a second resistor, coupled between the divided voltage output terminal and the second power rail,
   wherein the second resistor is constituted by a well, the well has a first doped region, a second doped region and a third doped region, the second resistor is formed between the first doped region and the second doped region, the third doped region is coupled to the capacitor, and the first resistor is formed between the third doped region and the first doped region.

2. The electrostatic discharge protection circuit according to claim 1, wherein the second resistor is constituted by the well with a first conductivity type.

3. The electrostatic discharge protection circuit according to claim 2, wherein the well is disposed in a substrate, the substrate has a second conductivity type.

4. The electrostatic discharge protection circuit according to claim 3, wherein the first conductivity type and the second conductivity type are different.

5. The electrostatic discharge protection circuit according to claim 3, wherein the second conductivity type of the substrate is P-type, the first conductivity type of the well is N-type.

6. The electrostatic discharge protection circuit according to claim 3, wherein the substrate is coupled to the second power rail through a plurality of connection windows.

7. The electrostatic discharge protection circuit according to claim 3, wherein the first doped region is coupled to the bulk of the second transistor, and the second doped region is coupled to the second power rail.

8. The electrostatic discharge protection circuit according to claim 7, wherein the substrate has a third doped region, the third doped region is coupled to the second power rail, and the first diode is formed between the third doped region and the first doped region.

9. The electrostatic discharge protection circuit according to claim 8, wherein a conductivity type of the third doped region is different from conductivity types of the first doped region and the second doped region.

10. The electrostatic discharge protection circuit according to claim 9, wherein the conductivity type of the third doped region is P-type, and the conductivity types of the first doped region and the second doped region are N-type.

11. The electrostatic discharge protection circuit according to claim 1, further comprising:
    a second diode, coupled between the bulk of the second transistor and the divided voltage output terminal.

12. The electrostatic discharge protection circuit according to claim 1, wherein the first transistor is a bipolar junction transistor, and the second transistor is a metal-oxide-semiconductor field-effect transistor.

13. The electrostatic discharge protection circuit according to claim 12, wherein the first transistor is an NPN-type bipolar junction transistor, the second transistor is an N-type metal-oxide-semiconductor field-effect transistor.

14. The electrostatic discharge protection circuit according to claim 1, wherein the capacitor has a first plate and a second plate, wherein the first plate is electrically connected to the first power rail through a plurality of first connection windows, the second plate is electrically connected to the control terminal of the second transistor through a plurality of second connection windows.

15. The electrostatic discharge protection circuit according to claim 1, wherein when a negative pulse voltage occurs between the first power rail and the second power rail, the negative pulse voltage conducts the first transistor through the first diode, and a current dissipating path for electrostatic discharge protection is provided through conducting the first transistor.

16. The electrostatic discharge protection circuit according to claim 1, wherein when a positive pulse voltage occurs between the first power rail and the second power rail, the capacitor and the voltage dividing circuit generate a bias voltage at the divided voltage output terminal according to the positive pulse voltage and conduct the first transistor according to the bias voltage, and a current dissipating path for electrostatic discharge protection is provided through conducting the first transistor.

17. The electrostatic discharge protection circuit according to claim 1, wherein the first power rail is used to receive a power voltage, and the second power rail is used to receive a ground voltage.

18. The electrostatic discharge protection circuit according to claim 1, wherein a drain of the second transistor is coupled to the first power rail, a source of the second transistor is coupled to the second power rail, the control terminal of the second transistor is a gate of the second transistor; a base of the first transistor is embedded in the bulk of the second transistor, a collector of the first transistor is embedded in the drain of the second transistor, and an emitter of the first transistor is embedded in the source of the second transistor.

* * * * *